(12) United States Patent
Vogtmann et al.

(10) Patent No.: US 6,505,635 B1
(45) Date of Patent: Jan. 14, 2003

(54) LIFTING AND RINSING A WAFER

(75) Inventors: Michael R. Vogtmann, San Luis Obispo, CA (US); Terry L. Lentz, San Luis Obispo, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/608,618

(22) Filed: Jun. 30, 2000

Related U.S. Application Data

(63) Continuation of application No. 09/247,109, filed on Feb. 9, 1999, now Pat. No. 6,102,057
(60) Provisional application No. 60/075,129, filed on Feb. 14, 1998.

(51) Int. Cl.⁷ ................................. B08B 3/02
(52) U.S. Cl. ..................... 134/144; 134/153; 134/179; 134/902
(58) Field of Search ................. 134/902, 144, 134/153, 179

(56) References Cited

U.S. PATENT DOCUMENTS 5,169,408 A * 12/1992 Satoh et al. ............ 134/144 X
5,421,056 A * 6/1995 Tateyama et al. ....... 134/153 X
5,591,262 A * 1/1997 Sago et al. ............. 134/902 X
5,954,072 A * 9/1999 Matsusita ............... 134/153 X
5,979,475 A * 11/1999 Satoh et al. ............ 134/153 X

* cited by examiner

*Primary Examiner*—Philip Coe
(74) *Attorney, Agent, or Firm*—Martine & Penilla, LLP

(57) ABSTRACT

A nozzle that extends telescopically upward is used to elevate a wafer without contacting the wafer. The nozzle includes a stationary hollow cylinder, closed at its lower end and open at its upper end, within which a spool is disposed to slide vertically. In its lowest position the spool is spaced from the closed bottom of the cylinder, and purified water is supplied under pressure to the space. A passage extends vertically through the spool, and the water is discharged at the upper end of the spool from the passage. As a wafer is lowered toward the upper end of the spool, the wafer partially impedes the discharge, increasing the pressure in the space below the spool. The increased pressure drives the spool and the wafer upward, but the wafer never comes into contact with the wafer because the discharge of water creates a protective cushion between them.

20 Claims, 12 Drawing Sheets

LIFTING AND RINSING A WAFER

This application is a continuation of Ser. No. 09/247,109 filed Feb. 9, 1998 now U.S. Pat. No. 6,102,057, which claims benefit of No. 60/075,129 filed Feb. 14, 1998.

BACKGROUND OF THE INVENTION

The present invention is in the field of semiconductor manufacturing and more specifically relates to improvements in apparatus for handling semiconductor wafers as they are carried through a planarizing machine.

As supplied to the planarizing machine, the surface of a wafer may exhibit departures from flatness. Typically, 25 wafers are loaded into a cassette which is hand carried to a complex machine called a planarizer. The purpose of the planarizer is to render the front surface of the wafer flat to within a fraction of a micron. After each wafer has been rendered flat, the planarizer inserts it into a cassette. When the cassette is full, it may be removed from the planarizer and transported to any of a number of other processing machines.

The present invention cannot be fully appreciated without an understanding of the operation of the planarizer. Once the cassette containing typically 25 pre-processed wafers has been inserted into the planarizer, the operation of the planarizer in processing the wafers is completely autonomous. The operations are carried out under control of a computer that controls the application of power to various actuators in response to sensed inputs in a time-coordinated manner. In order for its lengthy program of operations to be carried out without mishap, it is important that means be provided to interrupt the accumulation of positional errors. It can also be appreciated that the wafers must be handled carefully to avoid scratching the processed surfaces which are so fragile that they are never again touched by human hands.

The present invention can best be understood by following a typical wafer as it is moved through the planarizer. The wafer is extracted from the cassette by a portion of the planarizer called a robot. The robot carries the wafer to a fixed location known as the load station. After the robot has deposited the wafer at the load station and has moved out of the way, a different part (called a spindle carrier) moves into position above the wafer and acquires it. The spindle carrier transports the wafer to a rotating polishing platen and rotates the wafer while holding it in contact with the rotating polishing platen until the wafer has been rendered flat. Thereafter, the spindle lifts the wafer from the polishing platen and transports it back to the load station where the wafer is rinsed. After the spindle carrier has deposited the wafer at the load station and has moved out of the way, the robot picks up the polished wafer and carries it to a cassette and deposits the wafer in the cassette. Throughout these operations, the wafer is maintained in a horizontal position with the side that is to be polished facing downward. That downward facing side of the wafer is also referred to as the front side of the wafer. The path of an individual wafer through the planarizer will be depicted in greater detail below.

Upon reflection it will be seen that the main purpose of the load station is to accurately center the wafer into the carrier notwithstanding the errors in their relative positions as they enter the load station.

In addition to centering the wafer with respect to the carrier, the load station performs a number of useful ancillary functions. The load station includes provision for sensing the presence of the wafer at the load station, for rinsing the wafer, for lifting the wafer into the carrier, and for supporting the processed wafer on cushions of water to avoid direct contact. Thus, the load station serves several other functions in addition to centering the wafer with respect to the carrier.

SUMMARY OF THE INVENTION

The process of centering the wafer with respect to the spindle carrier must be completed before the spindle carrier acquires the wafer; once acquired, the wafer is drawn against the vacuum pad of the spindle carrier and cannot be shifted laterally. To guard against premature acquisition, at the end of the centering process, when the wafer is at its lowest position, a space is left between the upper surface of the wafer and the vacuum pad of the spindle carrier. Some way is needed to elevate the centered wafer into contact with the vacuum pad without contacting the fragile lower surface of the wafer.

In accordance with the present invention this is accomplished by the use of an unusual type of nozzle located beneath the center of the wafer. The nozzle extends telescopically upward to provide an upwardly-moving cushion of purified water that lifts the centered wafer up into contact with the vacuum pad of the spindle carrier, while preventing contact between the nozzle and the fragile lower surface of the wafer.

The nozzle includes a stationary hollow cylinder within which a vertically movable spool slides in a loose sliding fit. In its lowest position, the spool is spaced from the closed bottom of the cylinder, and the purified water is supplied under pressure to the space. A passage extends vertically through the spool. In the absence of a wafer, the spool remains in its lowest position and the water is discharged at the upper end of the spool from the passage.

As the wafer reaches its lowest position at the conclusion of the centering process, the wafer closely approaches the upper end of the spool but does not make contact with it. However, the wafer partially impedes the discharge of the water, thereby increasing the pressure in the space below the spool. This increased pressure, acting on the lower end of the spool, overcomes the weight of the spool and the weight of the wafer, which is supported on the liquid cushion that prevents the nozzle from making contact with the wafer. As the spool moves upward it lifts the wafer on the liquid cushion until the upper surface of the wafer makes contact with the vacuum pad on the underside of the spindle carrier. In the process of elevating the wafer, the spool also rinses the lower side of the wafer, the rinse water flowing outwardly from the center of the wafer.

The novel features which are believed to be characteristic of the invention, both as to organization and method of operation, together with further objects and advantages thereof, will be better understood from the following description considered in connection with the accompanying drawings in which a preferred embodiment of the invention is illustrated by way of example. It is to be expressly understood, however, that the drawings are for the purpose of illustration and description only and are not intended as a definition of the limits of the invention.

DETAILED DESCRIPTION OF THE PREFERRED EMBODIMENT

The present invention includes a series of operations carried out by a planarizing machine on a wafer that is to be planarized. Generally, the front surface, on which the electronic circuitry will be deposited is not as flat as required. The overall purpose of the planarizing machine is to render the front surface of each wafer as flat as possible.

The wafers are carried to the machine in an incoming cassette 16 in which the wafers are temporarily stored in a stacked configuration. The incoming cassette is inserted into the planarizing machine, and thereafter the machine processes the wafers autonomously, presenting the processed wafers in an outgoing cassette 24 of FIG. 10, which the operator removes from the machine. A typical cassette has a capacity of 25 wafers.

FIGS. 1–10 form a series showing schematically the path of a wafer as it progresses through the planarizing machine.

Figure 1:
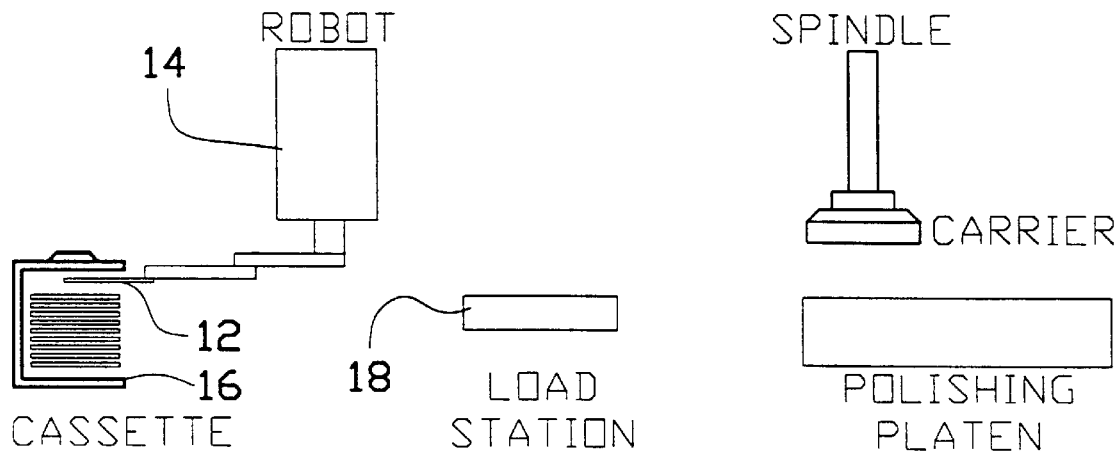
FIG. 1 is a diagram showing the use of a robot to remove a wafer from a cassette.

As shown in FIG. 1, a robot 14 removes the upper-most wafer 12 from the incoming cassette 16 and transports the wafer to a load station 18. In a preferred embodiment, the robot holds onto the wafer by applying suction to the upper surface of the wafer, also called the back side of the wafer, which is not the surface that is to be rendered flat.

Figure 2:
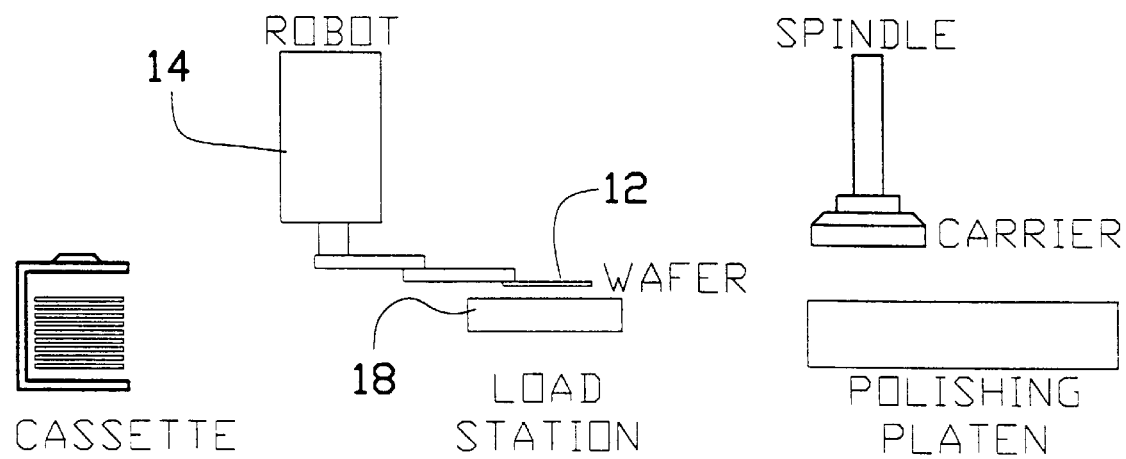
FIG. 2 is a diagram showing the robot placing a wafer on the load station.

As shown in FIG. 2, the robot 14 deposits the wafer 12 onto the load station 18. The robot then moves to an out-of-the-way station leaving the wafer reposing on a cushion of purified water provided by the load station, as will be described below.

Figure 3:
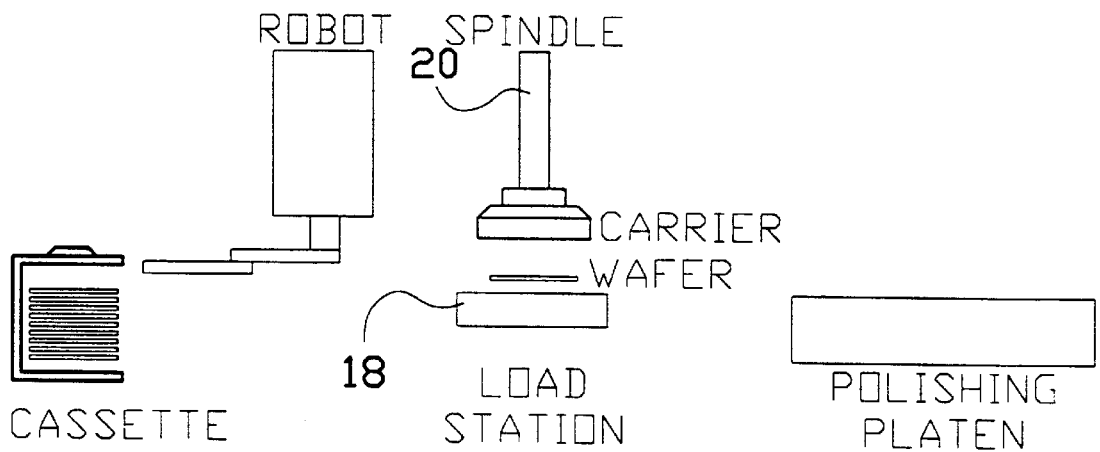
FIG. 3 is a diagram showing the spindle carrier after it has moved to a position directly above the load station.
Figure 4:
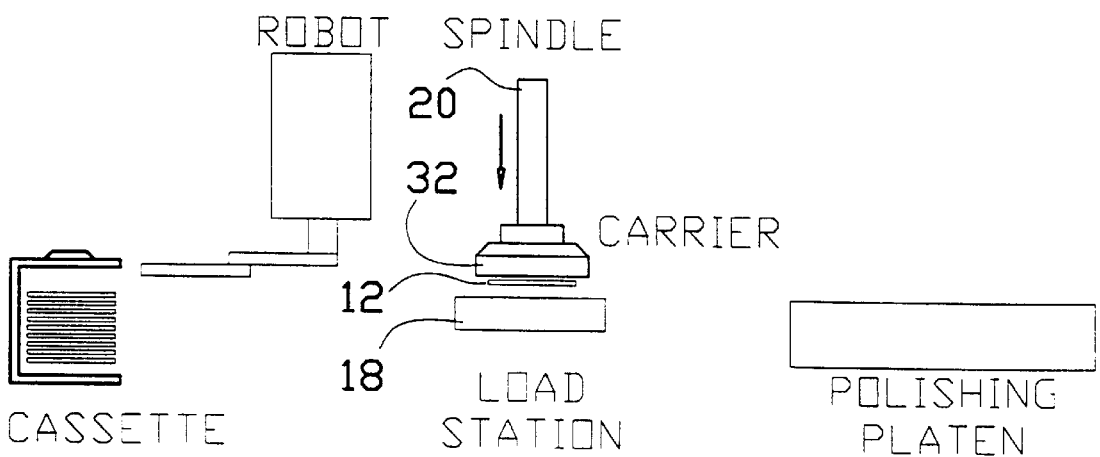
FIG. 4 is a diagram showing the spindle carrier descending onto the load station and acquiring the wafer.

Next, as shown in FIG. 3, the spindle 20 moves into a position directly above the load station 18, and as indicated in FIG. 4, the spindle is lowered onto the load station 18. As will be described below, the descending motion of the spindle 20 centers the load station 18 with respect to the spindle carrier 32 and simultaneously centers the wafer 12 with respect to the spindle carrier 32. At this juncture, an upwardly-directed jet of purified water directed against the lower face of the wafer lifts the centered wafer into contact with the carrier, which then acquires the wafer through the use of a vacuum system of the type described in U.S. Pat. No. 5,423,716 issued Jun. 13, 1995 to Alan Strasbaugh for WAFER-HANDLING APPARATUS HAVING A RESILIENT MEMBRANE WHICH HOLDS WAFER WHEN A VACUUM IS APPLIED, in U.S. Pat. No. 5,449,316 issued Sep. 12, 1995 to Alan Strasbaugh for WAFER CARRIER FOR FILM PLANARIZATION, and in U.S. application Ser. No. 08/971,642 filed Nov. 17,1997 by Salman M. Kassir and Thomas A. Walsh for GRINDING PROCESS AND APPARATUS FOR PLANARIZING SAWED WAFERS. The disclosures of U.S. Pat. No. 5,423,716 and 5,449,316 are incorporated herein by reference.

Figure 6:
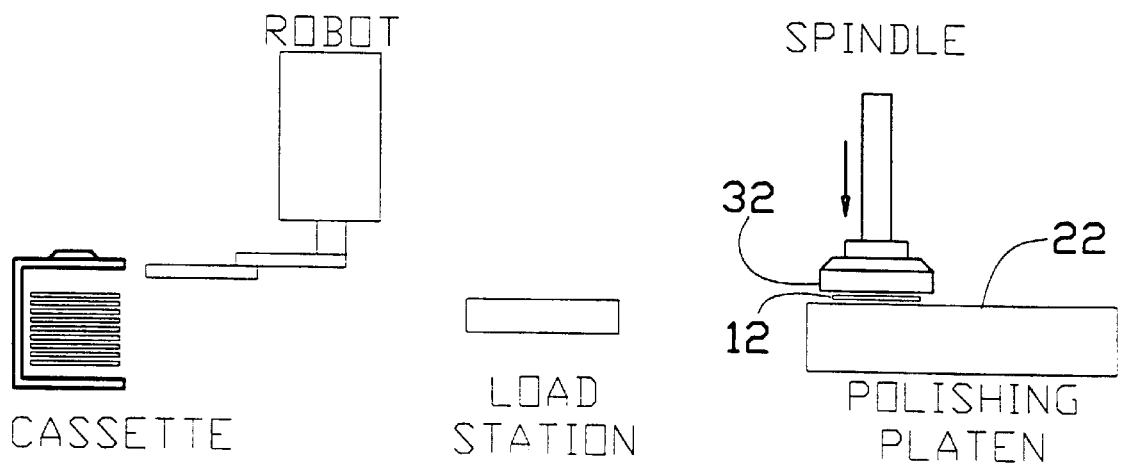
FIG. 6 is a diagram showing the spindle carrier holding the wafer on the polishing platen.

Having thus acquired the wafer, the spindle 20 lifts the wafer from the load station 18 and carries it to the polishing platen 22. The spindle 20 rotates the wafer 12 about a vertical axis that is displaced from the vertical axis about which the polishing platen rotates, as is known in the art. FIG. 6 shows the carrier holding the wafer 12 against the polishing platen 22, whereby the lower surface of the wafer is polished flat.

Figure 7:
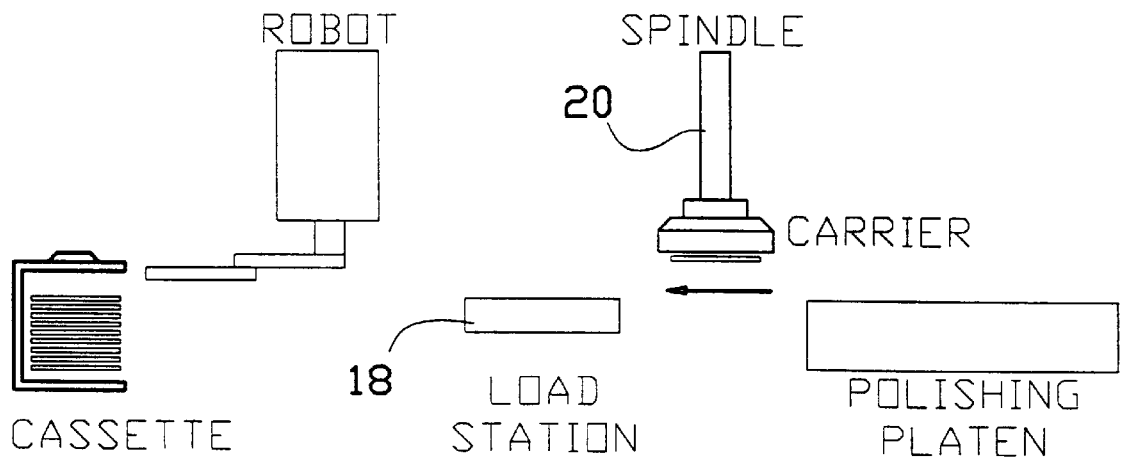
FIG. 7 is a diagram showing the spindle carrier transporting the polished wafer to the load station.
Figure 8:
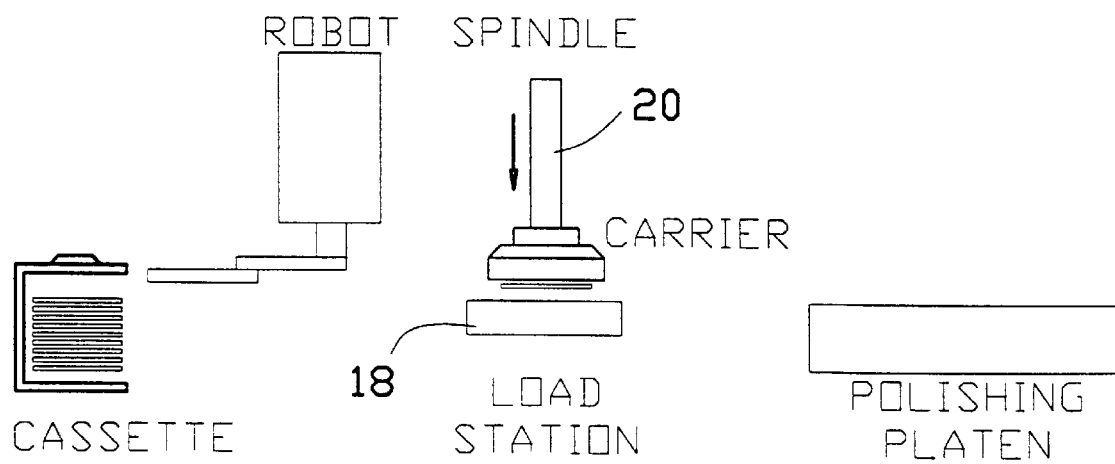
FIG. 8 is a diagram showing the spindle carrier depositing the polished wafer on the load station.
Figure 9:
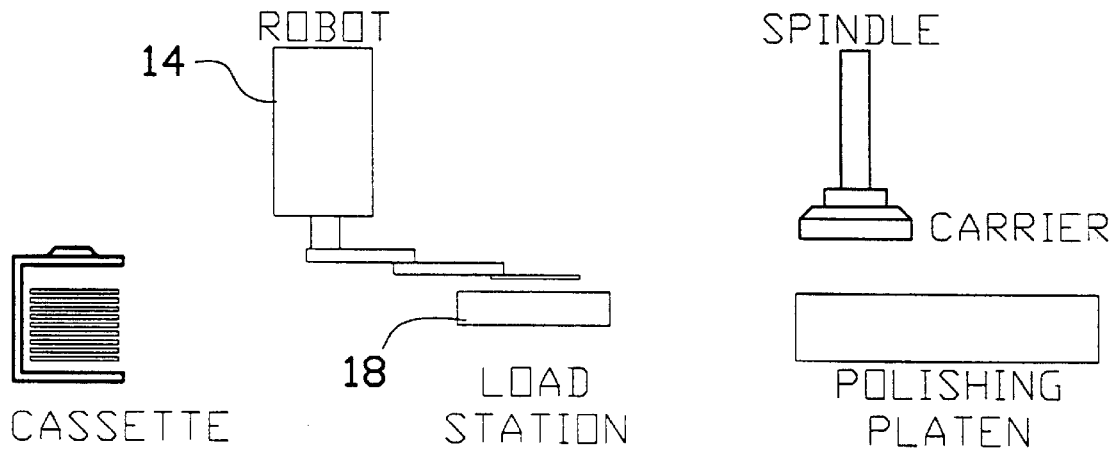
FIG. 9 is a diagram showing the robot removing the polished wafer from the load station after the spindle carrier has returned to its home station above the polishing platen.
Figure 10:
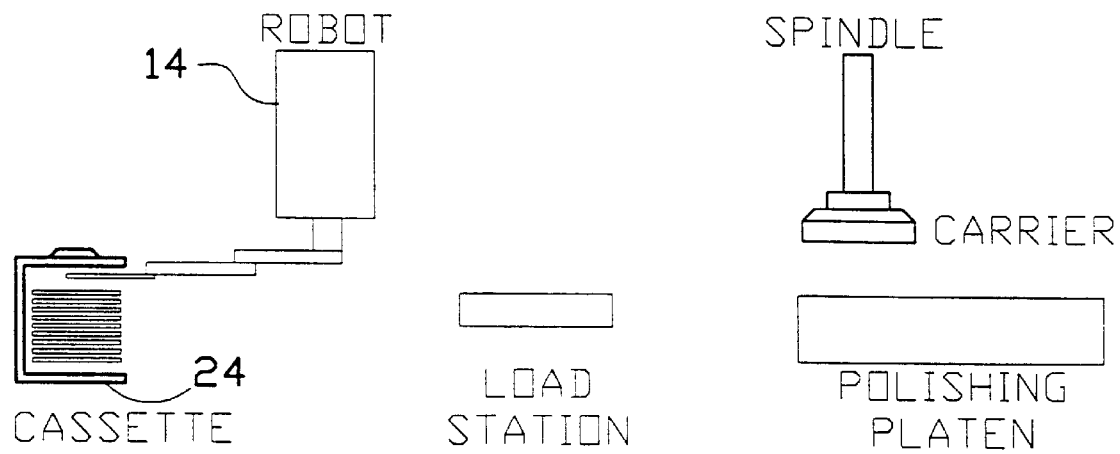
FIG. 10 is a diagram showing the robot placing the polished wafer into a cassette.

After the polishing has been completed, the planarized wafer is transported by the spindle 20 to the load station 18 and deposited there as shown in FIGS. 7 and 8. Thereafter, the spindle moves to an out-of-the-way position and the wafer is rinsed by the load station 18. Following this rinsing, the wafer is acquired by the robot 14 and transported to an outgoing cassette 24, as shown in FIGS. 9 and 10, respectively. Thereafter, the planarizing machine repeats the process with the next wafer which is upper-most in the incoming cassette 16 of FIG. 1.

More recent embodiments of the planarizing machine employ multiple polishing platens, robots, spindles, and load stations permitting two or more wafers to be processed simultaneously with the operations performed in parallel or staggered for maximum efficiency.

A portion of the spindle 20 called the carrier 32 is a ring-shaped part that encircles the wafer so as to retain the wafer in the spindle during the polishing process by preventing the wafer from slipping out sideways. The radial spacing between the circumference of the wafer and the inner edge of the carrier is typically a fraction of a millimeter. One of the most significant problems solved by the load station 18 is centering of the wafer with respect to the carrier ring to such a close tolerance. The initial placement of the wafer onto the load station, as indicated in FIG. 1, includes positional errors, and likewise, the positioning of the spindle 20 above the load station, as in FIG. 3, is also subject to position errors. Without some way of eliminating these various lateral position errors, it would be impossible for the wafer to be acquired within the carrier 32 of the spindle 20.

Figure 11:
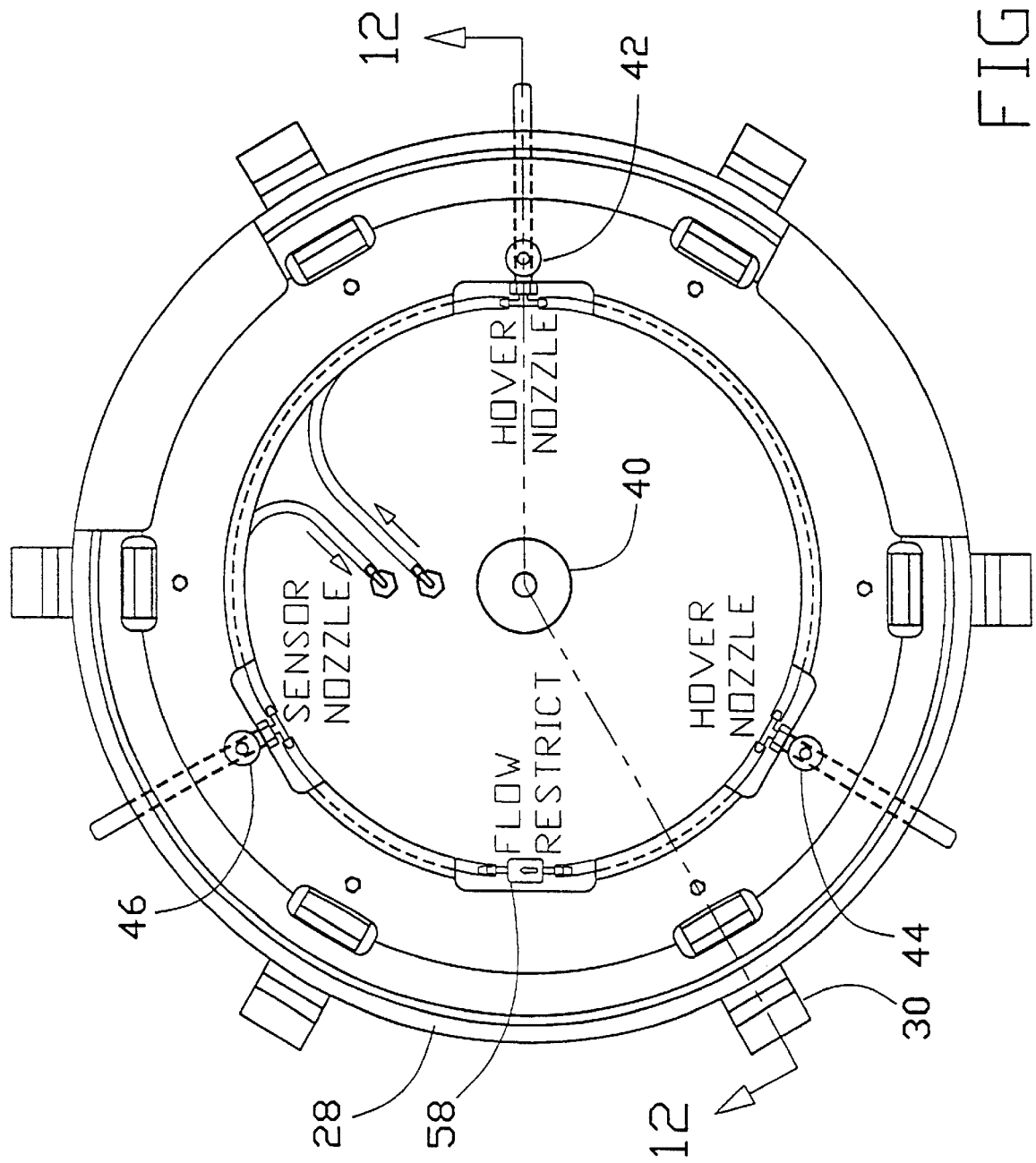
FIG. 11 is a top plan view of the load station of FIGS. 1–4.

In the preferred embodiment the centering action of the load station is accomplished in a manner which will now be described in connection with FIGS. 11, 12, and 13. The load ring assembly of FIG. 11 lies horizontally within a pan-like base 26. The load ring 28 is not rigidly attached to the base 26 and, in fact is capable of limited lateral sliding motion with respect to the base 26. A number, typically six, of centering tabs, of which the tab 30 is typical, are spaced around the circumference of the load ring 28. These tabs are pivotably attached to the load ring, each pivoting about its own horizontal axis that is tangent to the load ring. The tabs pivot from an unloaded position shown in FIG. 12 to a loaded position shown in FIG. 13. In the unloaded condition, the tabs are biased to the position shown in FIG. 12 by a helical spring 31, and the tab bends at a living hinge 36.

Figure 12:
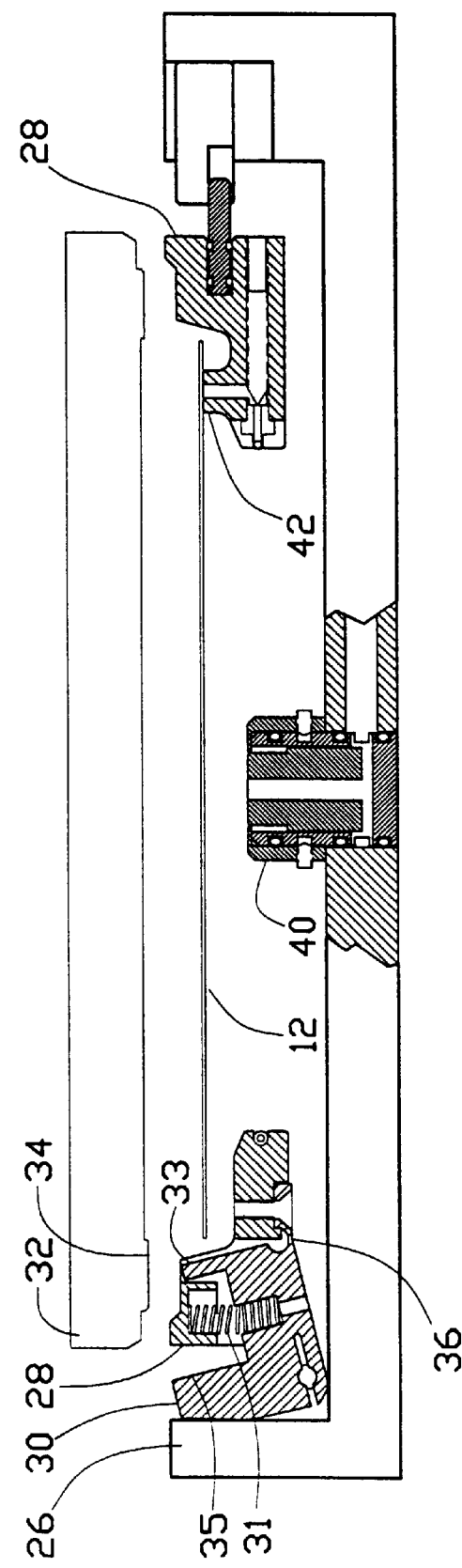
FIG. 12 is a side elevational view in cross section through the load station of FIG. 11, in the direction 12—12 indicated in FIG. 11, showing the configuration of the parts when the carrier first makes contact with the centering apparatus of the load station.

FIG. 12 shows the load station after the wafer has been deposited on it by the robot 14, but before the spindle carrier 32 has descended. FIG. 13 shows the load station after the spindle has descended to its lowest extent. Note that FIG. 12 is a view in the directions 12—12 shown in FIG. 11.

When first deposited onto the load station 18 the wafer 12 is unlikely to be concentric with the carrier 32 of the spindle 20, and as seen in FIG. 12, clearance is provided for lateral movement of the wafer. The wafer is levitated on cushions of purified deionized water that emerge under low pressure from the nozzles 42, 44, 46. In the preferred embodiment, there are three such nozzles, and the presence of the water flowing between the body of the nozzle 42, 44, 46 and the wafer prevents contact of the nozzle with the lower side of the wafer.

Figure 5:
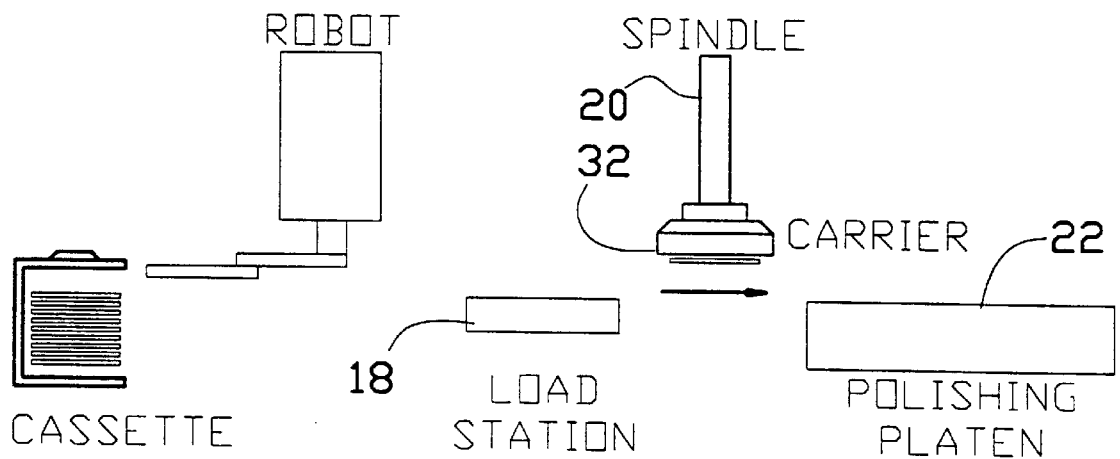
FIG. 5 is a diagram showing the spindle carrier transporting the wafer to a polishing platen.

As the spindle carrier is lowered onto the load station 18 as shown in FIG. 4, the horizontal lower surface 34 of the carrier 32 pushes downwardly against the top horizontal surface of the load ring 28 overcoming the biasing force of the helical spring 31 causing a first inward-facing surface 33 of the centering tab to swing radially inward until the inward-facing surface makes contact with the edge of the wafer 12. Concurrently, the pivoting of the centering tab brings a second inwardly facing surface 35 into contact with the circumference of the carrier 32. The carrier 32 is not free to move laterally, and therefore the load ring shifts laterally in an effort to center itself with respect to the carrier. At the conclusion of the downward motion of the spindle, the load ring 28 is centered with respect to the carrier 32, and the wafer is centered with respect to the load ring; therefore, the wafer is centered with respect to the carrier. Immediately thereafter, an upwardly-directed jet of water from the nozzle 40 elevates the wafer 12 into the carrier 32 and holds it in that position long enough for the vacuum system of the spindle carrier to acquire the wafer. Having thus acquired the wafer, the spindle then transports the wafer to the polishing platen 22 as shown in FIG. 5.

To avoid the possibility of accidentally damaging the front (lower) face of the wafer 12, both before and after it has been planarized, the wafer is always supported while at the load station 18 on three cushions of purified and deionized water. These cushions of water flow between the underside of the wafer and the upper end of the nozzles 42, 44 and 46 seen in FIG. 11. As best seen in FIGS. 12 and 13, these nozzles are attached to the load ring 28, so that as the load ring is pushed downwardly by the spindle, the nozzles 42, 44 and 46 move downward with the load ring, thereby continuing to support the wafer.

Figure 16:
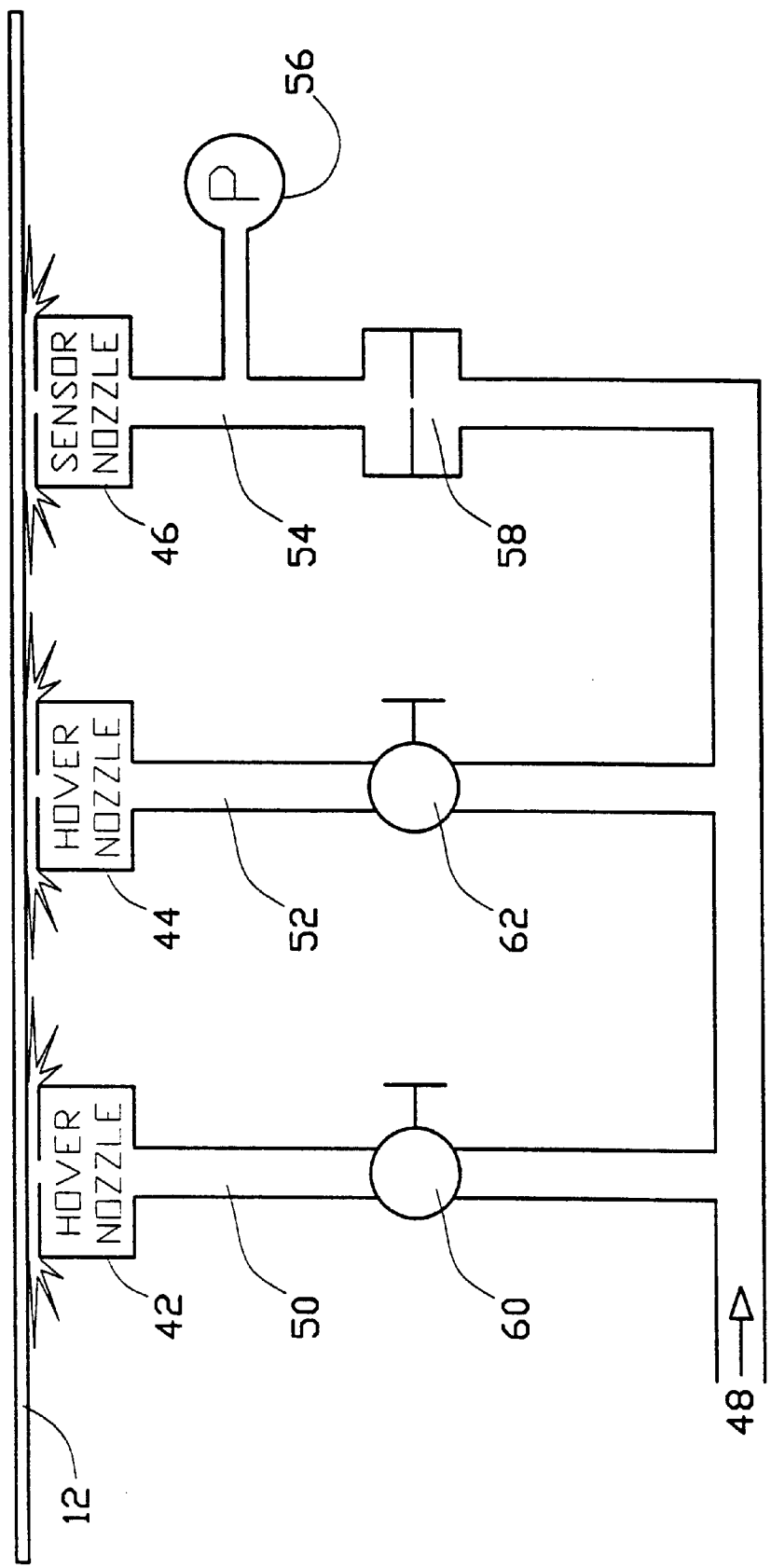
FIG. 16 is a hydraulic diagram of the hydraulic system used for hovering of the wafer and sensing its presence.

FIG. 16 is a hydraulic diagram showing how the nozzles are connected to a supply main 48. It has been found that a relatively low volumetric flow rate is adequate to prevent the wafer 12 from contacting the nozzles.

The present inventors have discovered that the nozzles 42, 44 and 46 can perform another useful function, in addition to levitating the wafer. The presence of the wafer as it is being levitated above the nozzles increases the resistance of each nozzle to the outflow of water. Clearly, if each nozzle were completely closed off, the pressure in the branches 50, 52 and 54 would become equal to the supply pressure. At the other extreme, if the nozzles 42, 44 and 46 offered no resistance to the flow, then the pressure in the branches 50, 52 and 54 would be considerably less than the supply pressure. The present inventors saw that this effect can be used to sense the presence of the wafer as it rests on the cushion of water between the tops of the nozzles and the lower side of the wafer. To implement this, the inventors have inserted a pressure sensor 56 in the branch 54 as shown in FIG. 16. The inventors have found that it is beneficial to insert a flow restrictor 58 in the branch 54 upstream of the pressure sensor 56. Valves 60 and 62 in the branches 50 and 52 respectively permit equalization of the flow through the nozzles.

Knowledge of whether a wafer is reposing on the load station 18, obtained by the pressure sensor 56, is useful in determining what the spindle 20 should do in the situation illustrated in FIG. 4 and in the situation illustrated in FIG. 8. The presence of a wafer on the load station in FIG. 3 results in the spindle descending to the position shown in FIGS. 4 and 13 so as to acquire the wafer. In contrast, the absence of a wafer on the load station in FIG. 8 results in the spindle descending only far enough to deposit the wafer on the nozzles 42, 44 and 46 as shown in FIG. 12.

Figure 13:
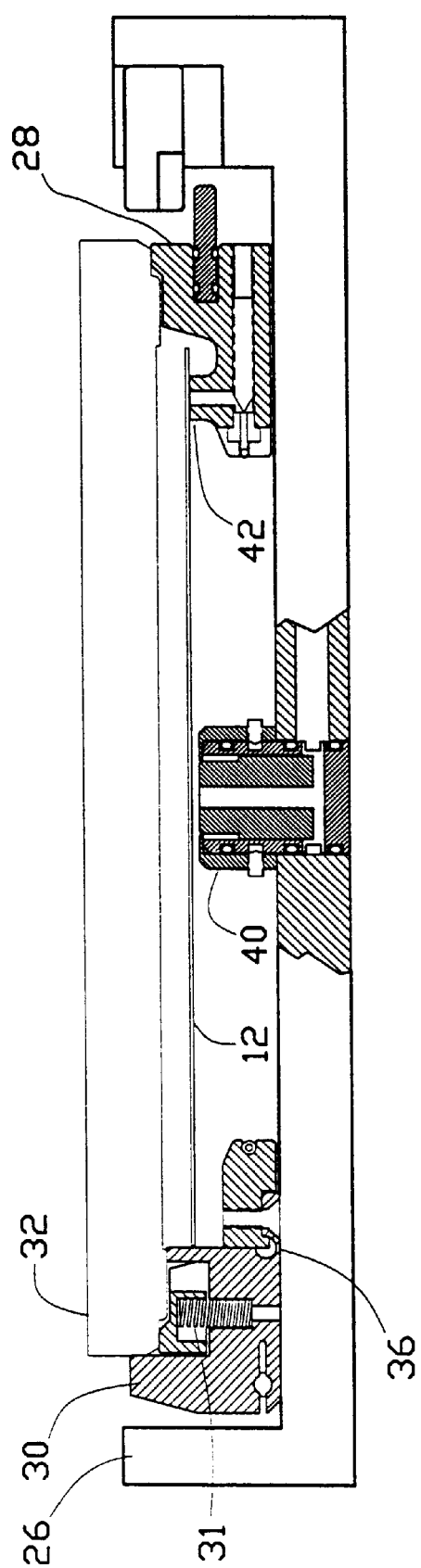
FIG. 13 is a side elevational cross sectional view through the load station of FIG. 11 showing the positions of the parts at the conclusion of the centering operation.
Figure 14:
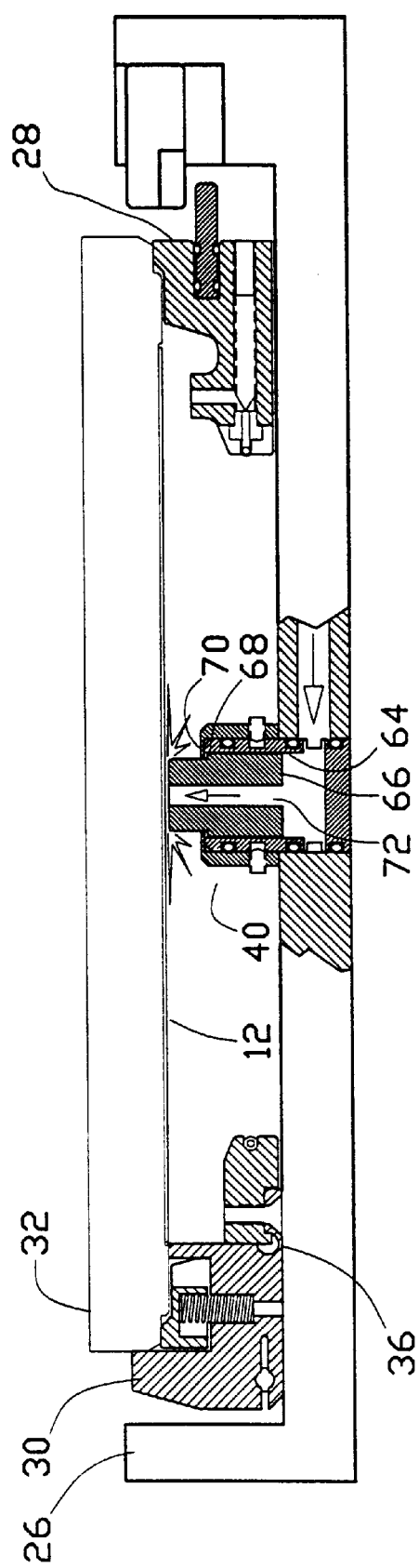
FIG. 14 is a side elevational cross sectional view through the load station of FIG. 11 showing the center nozzle actuated to lift the wafer into the carrier.

FIGS. 12, 13, and 14 show cross sectional views of nozzle 40. It will be recalled that this nozzle provides a stream of water directed upward toward the lower face of the wafer 12 for the purpose of elevating the wafer into contact with a vacuum pad within the spindle carrier, whereby the carrier acquires the wafer from the load station. As best seen in FIG. 14, the nozzle 40 includes a cylinder 64 within which a spool 66 is disposed in a loose sliding fit. This permits the spool 66 to move upward from the position shown in FIG. 13 to the position shown in FIG. 14 wherein a shoulder 68 on the spool is stopped by a flange 70. The spool 66 includes a central passage 72 through which the purified water is discharged.

After the carrier 32 is lowered into the load station to the position shown in FIG. 13, the upward flow of water out of the top of the spool 66 is partially impeded by the presence of the wafer. This causes an increase in pressure in the chamber immediately below the spool, thereby pushing the spool upwards within the cylinder 64 to the position shown in FIG. 14. At no time does the spool 66 touch the wafer (because of the water cushion), but as the wafer moves upward the spool is able to keep up with it, thereby maintaining an upward force on the wafer that pushes the upper surface of the wafer against a vacuum pad within the carrier, and holding the wafer against the pad until the vacuum causes the wafer to be secured to the carrier.

Figure 15:
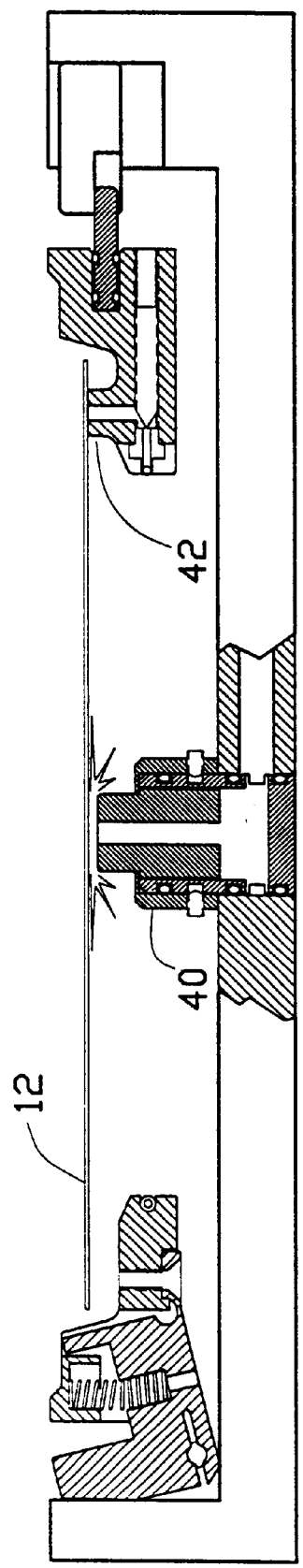
FIG. 15 is a side elevational cross sectional view through the load station of FIG. 11 showing the center nozzle rinsing the polished wafer.

The relatively strong upward stream discharged by the nozzle 40 rinses the wafer from the center outwardly seen in FIG. 15. The spool never contacts the wafer after the wafer has been polished.

Figure 18:
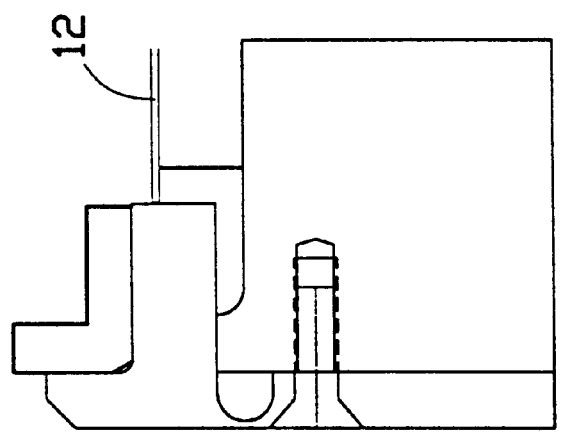
Figure 17:
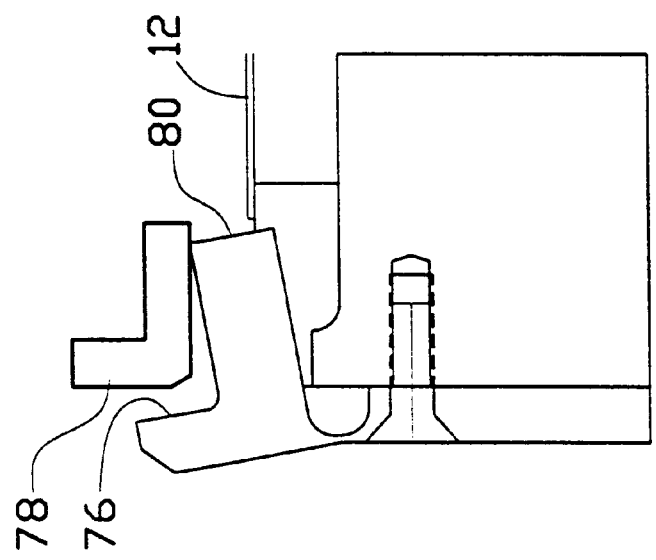
FIG. 17 is a side elevational view of an alternative embodiment of the centering apparatus showing its configuration at the instant the carrier portion of the spindle carrier first makes contact with the centering apparatus; and, FIG. 18 is a side elevational view of the alternative embodiment of the centering apparatus of FIG. 17 showing its configuration when the spindle carrier is in the lowest position with the wafer centered in the carrier.

FIGS. 17 and 18 show an alternative embodiment of the pivoting fingers 30 of FIGS. 12 and 13 FIG. 17 shows the configuration after the wafer 12 has been deposited but before the centering process has begun. FIG. 18 shows the configuration at the conclusion of the centering process.

As the spindle 20 descends from the position shown in FIG. 17 to the position shown in FIG. 18, the pivoting body 76 is forced to rotate clockwise (as seen in the drawings) until the surface 76 contacts the cylindrical outer surface of the carrier 78 thereby centering the load ring with respect to the carrier, while simultaneously, the surface 80 contacts the edge of the wafer 12 so as to center the wafer with respect to the load ring. As shown in FIG. 18, at the conclusion of the centering process the load ring is centered with respect to the carrier and the wafer is centered with respect to the load ring, and therefore the wafer must be centered with respect to the carrier.

Thus, there has been described a very useful load station for handling wafers within a planarizing machine. The load station interrupts the accumulation of positional errors by centering the wafer with respect to the carrier that is acquiring the wafer. The acquisition is accomplished without touching the front side of the wafer by use of a novel nozzle that elevates the wafer into the carrier by directing a jet of water against the front side of the wafer. At no time does the wafer actually make solid contact with the load station. Instead, the wafer is always levitated on three fountains of water. Back pressure caused by the wafer impeding the flow of water from these fountains is sensed and the sensed signal is used to indicate the presence of a wafer on the load station.

The foregoing detailed description is illustrative of one embodiment of the invention, and it is to be understood that additional embodiments thereof will be obvious to those skilled in the art. The embodiments described herein together with those additional embodiments are considered to be within the scope of the invention.

What is claimed is:

1. Apparatus for lifting a wafer that has been lowered in a horizontal attitude from an initial position to a lowest position while rinsing the underside of the wafer, comprising:

a hollow cylinder located below the wafer, and having a closed lower end, and having an open upper end that is spaced below the wafer when the wafer is in the lowest position;

a spool having an upper end and a lower end and a passage extending through the spool between the upper end and the lower end, the spool being configured for axial motion within the hollow cylinder from a lower position in which the upper end of the spool is spaced below the lowest position of the wafer to an upper position in which the upper end of the spool extends above the upper end of the hollow cylinder; and, a supply for supplying fluid under pressure into the hollow cylinder adjacent to the closed lower end of the hollow cylinder;

whereby, as the wafer is being lowered toward the lowest position, the pressurized fluid flows through the passage and is discharged from the upper end of the spool, and when the wafer reaches the lowest position the wafer partially impedes the discharge, thereby increasing the pressure of the fluid in the hollow cylinder below the spool and applying an upward force on the spool sufficient to overcome the weight of the spool, causing the spool to rise from the lower position to the upper position and thereby to uplift the wafer on a cushion of the fluid that prevents contact between the spool and the wafer, and whereby the wafer is rinsed by the fluid.

2. Apparatus for moving a wafer from a first position to a second position, the apparatus comprising:

a supply chamber having a guide surface and being configured to contain fluid having a pressure in a range from a first pressure to a second pressure; and a fluid distributor received in the supply chamber and configured to be guided by the guide surface in a range of locations from a first location to a second location, the fluid distributor being configured with a fluid distribution outlet so that when the fluid distributor is at the first location the fluid having the first pressure is released from the supply chamber into engagement with the wafer positioned at the first position, the first position being above the first location, the configuration of the fluid distributor further being such that when the fluid engages the wafer the wafer partially restricts the flow of the fluid out of the fluid distribution outlet and increases the pressure in the supply chamber, the pressure being increased to the second pressure, the configuration of the fluid distributor further being such that in response to the fluid having the second pressure the fluid distributor is guided by the guide surface and the fluid released from the supply chamber moves the wafer to the second position.

3. Apparatus as recited in claim 2, wherein, in the first and second positions, the wafer is positioned horizontally with an underside below an upper side, wherein the underside is not to be touched by the apparatus, and wherein:

the fluid released from the supply chamber via the fluid distribution outlet engages the underside of the wafer.

4. Apparatus as recited in claim 3, wherein:

during the guiding of the fluid distributor by the guide surface the wafer remains horizontal and the fluid continues to engage the underside of the wafer and lift the wafer without contact between the fluid distributor and the wafer.

5. Apparatus as recited in claim 2, wherein the wafer is movable to a third position, and wherein:

during the guiding of the fluid distributor in response to the fluid having the second pressure the wafer continues to partially restrict the flow of the fluid out of the outlet and the fluid moves the wafer toward the third position.

6. Apparatus as recited in claim 5, wherein:

the supply chamber is configured with a flange for engagement by the fluid distributor moving the wafer toward the third wafer position to limit movement of the fluid distributor.

7. A nozzle for lifting a wafer and rinsing the wafer with fluid without contact between the wafer and the nozzle, the nozzle comprising:

a supply for providing the fluid under pressure;

a cylinder having a closed end connected to the supply for receiving the fluid under pressure, the cylinder having an open end; and a piston received in and engaging the cylinder to prevent flow of the fluid around the piston and out of the open end, the piston being movable in the cylinder from adjacent to the closed end toward a first wafer lift position that is past the open end, the piston having a passage to permit the fluid under pressure to flow from the closed end through the piston toward the first wafer lift position and into contact with the wafer to lift and rinse the wafer.

8. A nozzle as recited in claim 7, wherein:

the piston has a first side facing the closed end and a second side movable past the open end, and the passage extends from the first side to the second side so that the fluid under pressure flowing through the piston flows into contact with the wafer.

9. A nozzle as recited in claim 8, wherein:

the second side is initially spaced from the first wafer lift position to allow the fluid under pressure and flowing through the piston to flow into contact with the wafer at the first wafer lift position and without contact between the wafer and the nozzle.

10. Apparatus as recited in claim 9, wherein:

during the movement of the piston in response to the fluid having the increased pressure the wafer continues to partially impeded the flow of the fluid through the passage so that the fluid continues to have the increased pressure and continues to flow into contact with the wafer and move the wafer toward a third wafer lift position while rinsing the wafer.

11. Apparatus as recited in claim 10, wherein:

the cylinder is configured with a flange for engagement by the piston moving the wafer toward the third wafer lift position to limit movement of the piston.

12. A nozzle as recited in claim 8, wherein:

the piston is movable toward a second wafer lift position that is past the first wafer lift position;

the piston is configured so that when the fluid flows into contact with the wafer the wafer partially impedes the flow of the fluid through the piston and the pressure of the fluid adjacent to the closed end increases; and the piston is further configured to be movable toward the second wafer lift position in response to the increased pressure while the partially impeded fluid continues to flow through the piston into contact with the wafer to move the wafer to the second wafer lift position while the fluid continues to rinse the wafer.

13. Apparatus for lifting a wafer having an exposed underside that may be contacted by fluid but not by the apparatus, the apparatus comprising:

a chamber located below a first position from which the wafer is to be lifted, the chamber having a closed end and having an open end that is spaced below the first position;

a supply of the fluid connected to the closed end for introducing the fluid into the chamber, the introduced fluid having a first pressure value and tending to fill the chamber; and a member having a first end configured to block the fluid having the first pressure value, the member having a second end, the member having a passage extending between the first end and the second end to permit the blocked fluid to flow from the supply through the passage to and over the second end into engagement with the underside of the wafer that is in the first position, the underside restricting the flow through the passage and increasing the pressure of the fluid blocked by the first end to a second pressure value exceeding the first pressure value, the member being telescoped within the chamber for movement in response to the fluid having the second pressure value.

14. Apparatus as recited in claim 13, wherein:

the movement of the member in response to the fluid having the second pressure value moves the second end toward the first position at the same time as the restricted flow of the fluid continues to flow through the passage and over the second end into engagement with the underside of the wafer, the movement of the member and the continued fluid flow moving the wafer to a second position while the flow rinses the wafer.

15. Apparatus as recited in claim 13, wherein:

during the movement of the member in response to the fluid having the second pressure value the underside continues to restrict the flow of the fluid through the passage so that the restricted fluid continues to have a value exceeding the first pressure value and continues to flow over the second end into engagement with the underside of the wafer and move the wafer to a third wafer lift position while rinsing the wafer.

16. Apparatus as recited in claim 15, wherein:

during the movement of the member in response to the fluid having the pressure value exceeding the first pressure value the underside continues to restrict the flow of the fluid through the passage so that the restricted fluid continues to have the value exceeding the first pressure value and continues to flow over the second end into engagement with the underside of the wafer and move the wafer toward a third position while rinsing the wafer; and the chamber is configured with a flange for engagement by the member moving toward the third wafer lift position to limit movement of the member.

17. Apparatus for lifting a wafer in a horizontal orientation from a lift initiation position at which an underside of the wafer is exposed, the exposure being from a center of the wafer outwardly to an edge, the apparatus comprising:

a hollow cylinder located below the lift initiation position and having a vertical axis coaxial with the center of the wafer when the wafer is in the lift initiation position and having an open upper end that is spaced below the lift initiation position, the hollow cylinder having a closed end;

a supply of fluid connected to the closed end of the cylinder for introducing fluid having a first pressure into the hollow cylinder, the fluid having the first pressure tending to fill the hollow cylinder; and a hollow member having a first end, and having a second end spaced from the closed end and blocking the fluid that has the first pressure and that tends to fill the hollow cylinder, and having a central passage extending between the first end and the second end to permit the blocked fluid having the first pressure to flow from the supply to and over the first end into contact with the underside of the wafer that is in the lift initiation position, the underside partially impeding the flow to the first end so that there is an increase in the pressure of the impeded fluid to a second pressure having a value exceeding the value of the first pressure, the hollow member being configured to be moved axially by the fluid having the second pressure so that the first end of the member moves and the flow over the first end moves and both rinses the underside of and lifts the wafer in the horizontal orientation away from both the cylinder and from the lift initiation position without having the wafer contact the apparatus.

18. Apparatus as recited in claim 17, wherein:

the hollow member is configured to be axially stationary in response to the fluid having the first pressure so that so long as the wafer is above the lift initiation position the underside of the wafer will not impede the flow to the first end and the first end will not contact the underside of the wafer.

19. Apparatus as recited in claim 18, wherein:

during axial movement of the member in response to the fluid having the second pressure the underside continues to partially impede the flow of the fluid to the first end so that the partially impeded fluid continues to have the second pressure and continues to flow over the first end into engagement with the underside of the wafer and the movement of the member and the continued flow over the first end continues to move the wafer toward a final wafer lift position.

20. Apparatus as recited in claim 19, wherein the member is configured with a shoulder; and the hollow cylinder is configured with a flange positioned to engage the shoulder and stop the axial movement of the member when the wafer reaches the final wafer lift position.

* * * * *